United States Patent
Xia et al.

(10) Patent No.: US 12,183,586 B2
(45) Date of Patent: Dec. 31, 2024

(54) METHOD FOR FORMING SEMICONDUCTOR STRUCTURE

(71) Applicant: CHANGXIN MEMORY TECHNOLOGIES, INC., Hefei (CN)

(72) Inventors: Jun Xia, Hefei (CN); Kangshu Zhan, Hefei (CN); Sen Li, Hefei (CN); Penghui Xu, Hefei (CN); Qiang Wan, Hefei (CN); Tao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 527 days.

(21) Appl. No.: 17/504,636

(22) Filed: Oct. 19, 2021

(65) Prior Publication Data
US 2022/0246437 A1 Aug. 4, 2022

Related U.S. Application Data

(63) Continuation of application No. PCT/CN2021/108401, filed on Jul. 26, 2021.

(30) Foreign Application Priority Data

Jan. 29, 2021 (CN) .......................... 202110128741.8

(51) Int. Cl.
*H01L 21/308* (2006.01)
*H01L 21/3105* (2006.01)
(Continued)

(52) U.S. Cl.
CPC .... *H01L 21/3086* (2013.01); *H01L 21/31053* (2013.01); *H01L 21/31144* (2013.01); *H01L 21/76224* (2013.01); *H10B 12/0387* (2023.02)

(58) Field of Classification Search
CPC ........... H01L 21/3086; H01L 21/31053; H01L 21/31144; H01L 21/76224; H10B 12/0387; H10B 12/033; H10B 12/09
See application file for complete search history.

(56) References Cited

U.S. PATENT DOCUMENTS

| 2020/0098763 A1* | 3/2020 | Bae | ................ | H01L 21/31144 |
| 2022/0130720 A1* | 4/2022 | Xia | .................. | H01L 21/76831 |

FOREIGN PATENT DOCUMENTS

| CN | 1983553 A | 6/2007 |
| CN | 108538835 A | 9/2018 |

(Continued)

OTHER PUBLICATIONS

International Search Report & Written Opinion for application No. PCT/CN2021/108401, dated Oct. 28, 2021, 8 pages.

*Primary Examiner* — Laura M Menz
*Assistant Examiner* — Candice Chan
(74) *Attorney, Agent, or Firm* — Kilpatrick Townsend & Stockton LLP

(57) ABSTRACT

An embodiment of the application provides a method for forming a semiconductor structure. The semiconductor structure includes a first region and a second region. The method includes the following steps: providing a base, an insulating layer, and a mask layer that are stacked in sequence, where the first region has at least one trench penetrating the mask layer and the insulating layer, and the mask layer has an upper surface in the second region higher than that in the first region; forming a first protection layer, where an upper surface and a sidewall of the mask layer in the first region are covered with the first protection layer; after the first protection layer is formed, removing the mask layer in the second region; subsequent to removal of the mask layer in the second region, removing the first protection layer; and removing the mask layer in the first region.

16 Claims, 8 Drawing Sheets

(51) Int. Cl.
*H01L 21/311* (2006.01)
*H01L 21/762* (2006.01)
*H10B 12/00* (2023.01)

(56) References Cited

FOREIGN PATENT DOCUMENTS

CN 109952645 A 6/2019
KR 20030050848 A 6/2003

\* cited by examiner

METHOD FOR FORMING SEMICONDUCTOR STRUCTURE

CROSS-REFERENCE TO RELATED APPLICATIONS

This application is a continuation of International Patent Application No. PCT/CN2021/108401 filed on Jul. 26, 2021, which claims priority to Chinese Patent Application No. 202110128741.8 filed on Jan. 29, 2021. The above-referenced patent applications are incorporated herein by reference in their entirety.

TECHNICAL FIELD

An embodiment of the present application relates to the field of semiconductors, and particularly, to a method for forming a semiconductor structure.

BACKGROUND

A dynamic random access memory (DRAM) is a semiconductor storage device commonly used in computers, which consists of many repeated memory cells. With the continuous evolution of a DRAM preparing process, an integration level continues to increase, and a size of elements continues to shrink. In the DRAM preparing process, DRAM uses a stacked capacitor structure. A capacitor has a vertical cylindrical shape with a high aspect ratio to increase a surface area, and includes a lower electrode layer connected to a substrate, a capacitor dielectric layer deposited on the lower electrode layer, and an upper electrode layer deposited on the capacitor dielectric layer.

In a prior art, an insulating layer is directly etched with a patterned mask layer in a first region to form a trench for depositing the lower electrode layer, the dielectric layer, and the upper electrode layer. Then, a mask layer on an upper surface of the insulating layer in a second region and a mask layer on the upper surface of the remaining insulating layer in the first region are removed. When the trench is formed in the first region, a part of a thickness of the mask layer in the first region is etched. Therefore, after the trench is formed, the mask layer in the first region has a thickness smaller than the mask layer in the second region. In a process for removing the mask layer, since the mask layers in different regions have different thickness, after the process of removing the mask layer is completed, a part of the mask layer in the second region has residues, and a part of the insulating layer in the first region is etched, resulting in unevenness in the semiconductor structure and reducing the performance of the semiconductor structure.

How to improve the flatness of the semiconductor structure has become an urgent problem to be solved by those skilled in the art.

SUMMARY

An embodiment of the present application provides a method for forming a semiconductor structure, which solves the problems of damages to an insulating layer in a first region and residues of a mask layer in a second region when the semiconductor structure is formed.

An embodiment of the application provides a method for forming a semiconductor structure. The semiconductor structure includes a first region and a second region. The method includes the following steps: providing a base, an insulating layer, and a mask layer that are stacked in sequence, where the first region has at least one trench penetrating the mask layer and the insulating layer, and the mask layer has an upper surface in the second region higher than that in the first region; forming a first protection layer, where the upper surface and a sidewall of the mask layer in the first region are covered with the first protection layer; after the first protection layer is formed, removing the mask layer in the second region; after removing the mask layer in the second region, removing the first protection layer; and removing the mask layer in the first region.

BRIEF DESCRIPTION OF DRAWINGS

One or more embodiments are described by using examples with reference to diagrams in drawings corresponding to the embodiments. These example descriptions do not constitute a limitation to the embodiments. Elements with the same reference signs in the drawings indicate similar elements. Unless otherwise stated, the diagrams in the drawings do not constitute a proportional limitation.

DESCRIPTION OF EMBODIMENTS

It can be known from the background that a flatness of a semiconductor structure in a prior art is relatively low.

Figure 1:
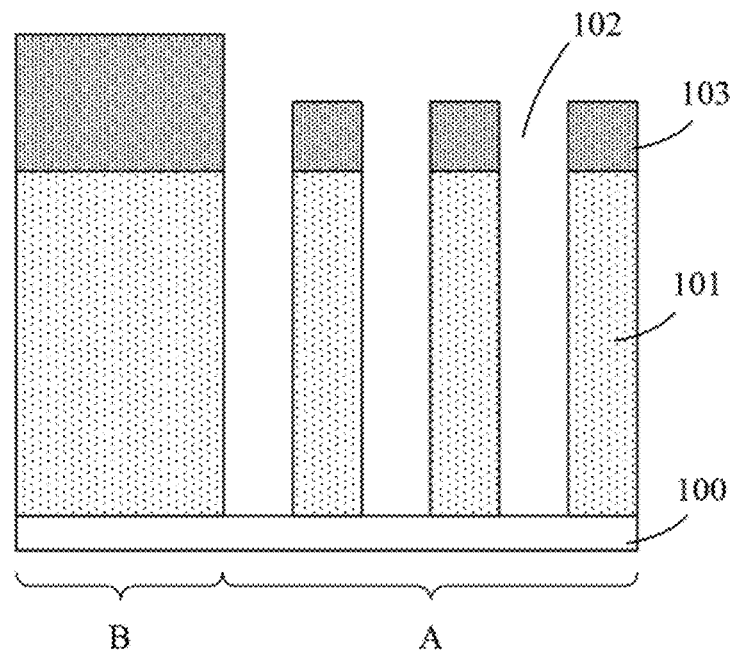
FIGS. 1 and 2 are schematic structural diagrams of steps of a method for forming a semiconductor structure.
Figure 2:
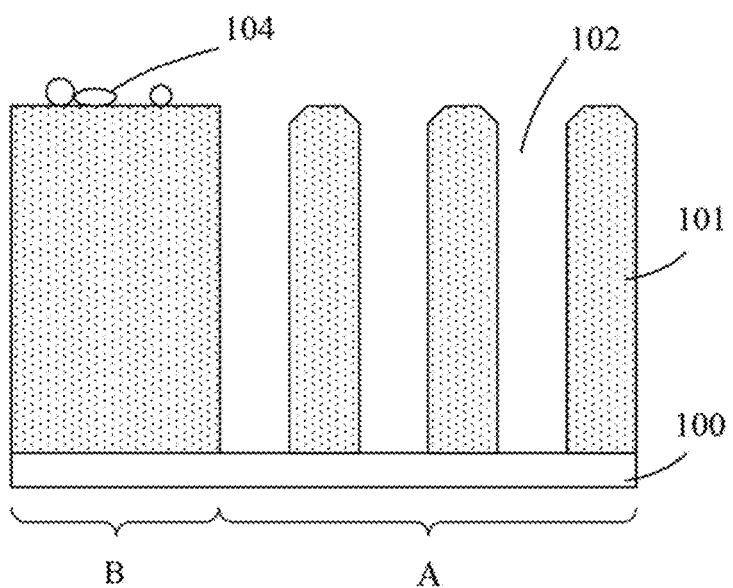

FIGS. 1 to 2 are schematic structural diagrams of steps of a method for forming a semiconductor structure.

Referring to FIG. 1, the semiconductor structure has a first region A and a second region B, and includes a base 100, an insulating layer 101, and a mask layer 103 that are stacked in sequence. When at least one trench 102 penetrating the mask layer 103 and the insulating layer 101 is formed in the first region A, a part of a thickness of the mask layer 103 in the first region A is etched. Therefore, after the trench 102 is formed, the mask layer 103 has an upper surface in the second region B higher than that in the first region A. Referring to FIG. 2, after the trench 102 is formed, the mask layer 103 in the first region A and the second region B is removed at the same time. Under a same removal process condition, a removed thickness of the mask layers 103 in the first region A and the second region B is the same. Prior to a removal process, the mask layer 103 in the second region B has a thickness greater than the mask layer 103 in the first region A. Therefore, when the mask layer 103 in the first region A is removed completely, some residues 104 in the second region B are still provided. The remaining residues 104 continue to be removed, which causes a part of the insulating layer 101 in the first region A to be etched. In combination of FIGS. 1 and 2, after a process for removing the mask layer 103 is completed, the second region B has some residues 104 and/or the insulating layer 101 in the first region A is damaged, which results in uneven semiconductor structures formed, thereby reducing a performance of the semiconductor structure.

To solve the forgoing problems, an embodiment of the present application provides a method for forming a semiconductor structure. Prior to removal of a mask layer, a first protection layer covering a sidewall and an upper surface of the mask layer in a first region is formed. The mask layer in the first region and the mask layer in a second region are removed separately. The mask layer in the second region is first removed. Since the upper surface and the sidewall of the mask layer in the first region have the first protection layer, the mask layer in the first region is not affected in the process of removing the mask layer in the second region, thereby improving flatness of the semiconductor structure.

In order to make objectives, technical solutions, and advantages of the embodiments of the present application clearer, various embodiments of the present application are described in detail below with reference to drawings. However, those skilled in the art can understand that in each embodiment of the present application, many technical details are proposed for a reader to better understand the present application. However, even without these technical details and various changes and modifications based on the following embodiments, the technical solutions claimed in the present application can be realized.

Figure 3:
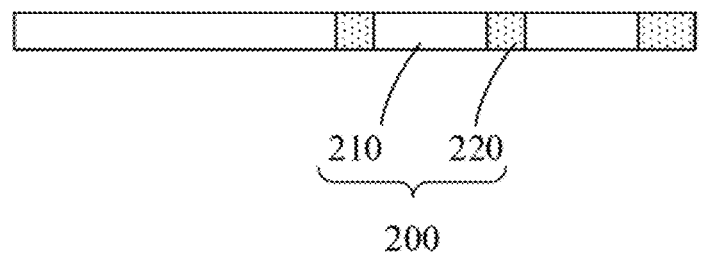
FIGS. 3 to 12 are schematic structural diagrams of steps of a method for forming a semiconductor structure according to a first embodiment of the present application.

FIGS. 3 to 12 are schematic structural diagrams of steps of a method for forming a semiconductor structure according to a first embodiment of the present application, where FIG. 3 is a detailed schematic structural diagram of a base of the semiconductor structure.

Figure 4:
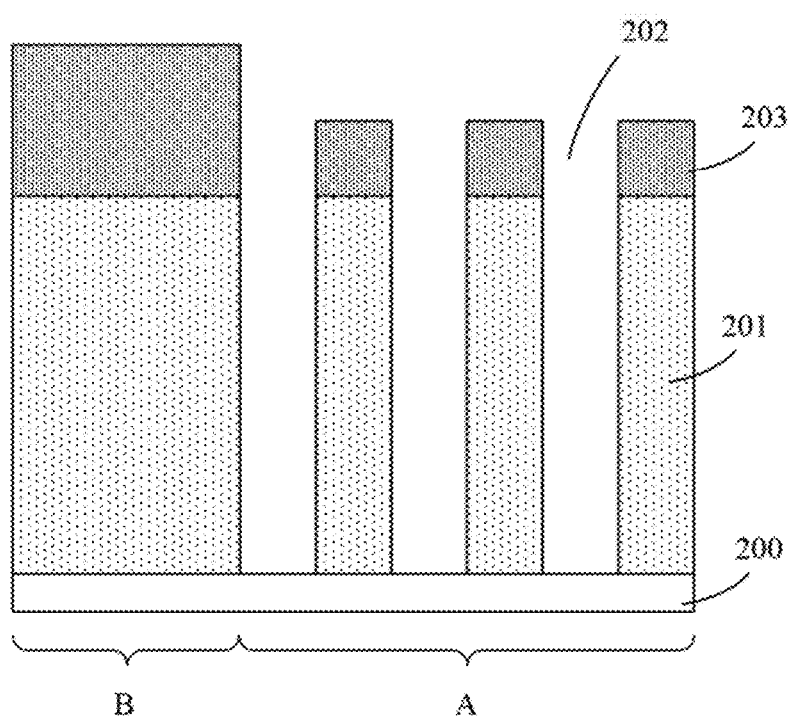

Referring to FIGS. 3 and 4, in this embodiment, the semiconductor structure includes a first region A and a second region B. The method includes the following step: providing a base 200, an insulating layer 201, and a mask layer 203 that are stacked in sequence, where the first region A has at least one trench 202 penetrating the mask layer 203 and the insulating layer 201. The mask layer 203 has an upper surface in the second region B higher than that in the first region A.

The semiconductor structure includes an array region and a peripheral region located around the array region. The array region includes a cell region and a non-cell circuit region. In this embodiment, the first region A is the cell region, and the second region B is the non-cell circuit region. After the mask layer 203 is removed, a lower electrode layer, a dielectric layer, and an upper electrode layer are subsequently formed in the trench 202 in the first region A. In addition, the mask layer 203 in the first region A has a pattern density greater than the mask layer 203 in the second region B.

In this embodiment, the base 200 includes a conductive layer 210 and an isolating layer 220. The isolating layer 220 is located at a bottom of the insulating layer 201 in the first region A and is in contact with the insulating layer 201 in the first region A.

A material of the conductive layer 210 includes conductive materials such as tungsten metal, silver metal, gold metal, or the like. The conductive layer 210 can be configured as a contact structure of a storage node.

A material of the isolating layer 220 includes insulating materials such as silicon nitride, silicon oxide, or the like.

The material of the insulating layer 201 includes insulating materials such as silicon nitride, silicon oxide, or the like. The insulating layer 201 is configured as a supporting layer. The supporting layer is configured to play a role of support during subsequent formation of the lower electrode layer of a capacitor. The formed lower electrode layer is located on a sidewall of the supporting layer.

In order to form at least one trench 202 penetrating the insulating layer 201 with a suitable position and size in the first region A, it is necessary to form the mask layer 203 on upper surfaces of the insulating layers 201 in the first region A and the second region B before the trench 202 is formed. The mask layer 203 and a part of the insulating layer 201 are etched in the first region A. At least one trench 202 penetrating the mask layer 203 and the insulating layer 201 is formed in the first region A.

Before the trench 202 is formed, the upper surface of the mask layer 203 in the first region A is flush with the upper surface of the mask layer 203 in the second region B. In order to form the trench 202 in the first region A for subsequent formation of the lower electrode layer, the dielectric layer, and the upper electrode layer, the trench 202 needs to be formed in the first region A. Since the mask layer 203 in the first region A has a width smaller than the mask layer 203 in the second region B, the first region A has a pattern density greater than the second region B. Therefore, when the trench 202 is formed in the first region A, the mask layer 203 in the first region A etched by an etching gas has a thickness greater than the mask layer 203 in the second region B due to an etching load effect. Therefore, after the trench is formed, the mask layer 203 in the first region A has the thickness smaller than the mask layer 203 in the second region B. Therefore, the mask layer 203 has the upper surface in the second region B higher than that in the first region A.

A material of the mask layer 203 includes polysilicon. The mask layer 203 is configured to protect the insulating layer when the trench 202 is formed.

Figure 5:
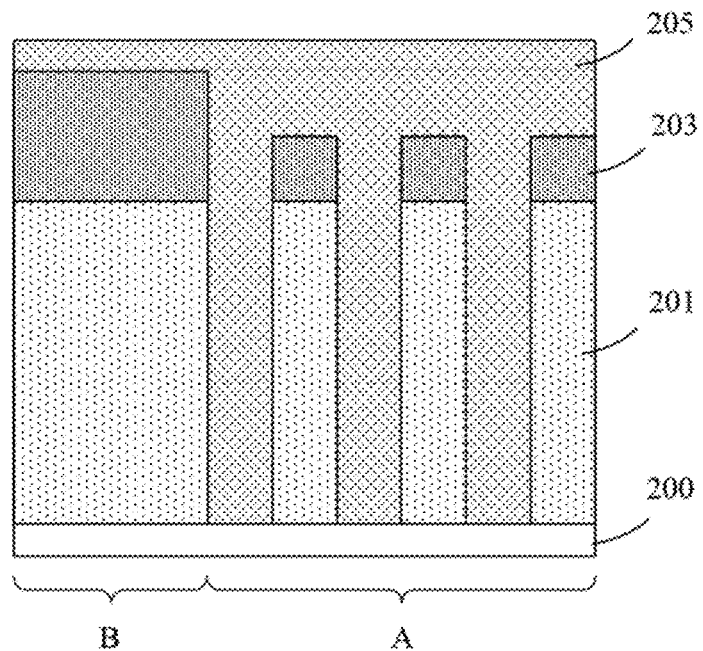
Figure 6:
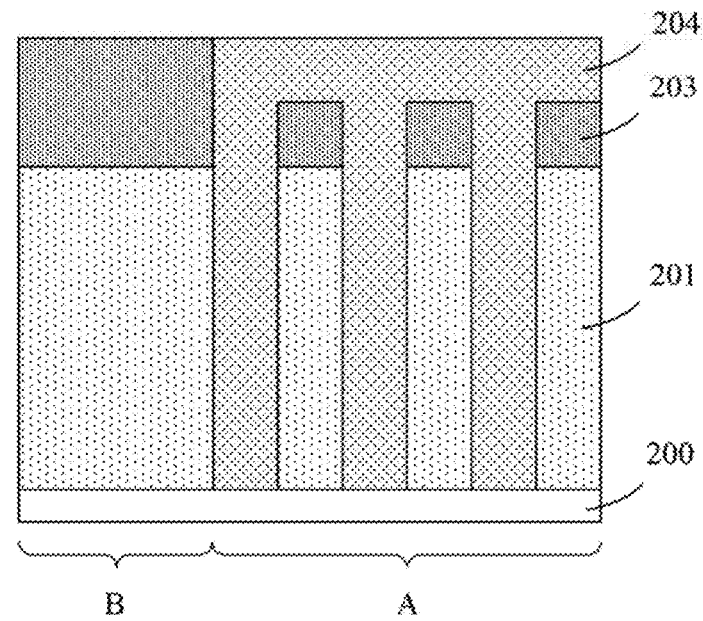

Referring to FIGS. 5 and 6, in this embodiment, a first protection layer 204 is formed. The upper surface and the sidewall of the mask layer 203 in the first region A are covered with the first protection layer 204.

The first protection layer 204 is formed on the upper surface and the sidewall of the mask layer 203 in the first region A. The mask layers 203 in the first region A and the second region B are removed step by step. Due to the first protection layer 204, when the mask layer 203 in the second region B is removed, the mask layer 203 in the first region A is protected from being affected. The mask layer 203 in the first region A is then removed to ensure that after the mask layer 203 is removed, no residue of the mask layer is left in the second region B and no effect is made to a topography of the insulating layer 201 in the first region A, thereby improving a flatness of the topography of the semiconductor structure.

In this embodiment, the upper surface and the sidewall of the mask layer 203 in the first region A are covered with the first protection layer 204, and the trench 202 is filled up with the formed first protection layer 204. The upper surface of the mask layer 203 in the first region A is covered with the first protection layer 204.

The step of forming the first protection layer 204 of this embodiment is as follows: firstly, forming an initial protection layer 205, where the trench 202 is filled up with the formed initial protection layer 205, and the upper surface of the mask layer 203 in the second region B is covered with the initial protection layer 205; after the initial protection layer 205 is formed, removing the initial protection layer 205 on the upper surface of the mask layer 203 in the second region B to expose the mask layer 203 in the second region B, where the remaining initial protection layer 205 is taken as the first protection layer 204. In this embodiment, the initial protection layer 205 is formed with a chemical vapor deposition process. The chemical vapor deposition process has a fast deposition rate, saves production time, and helps improve production efficiency of the semiconductor structure.

In this embodiment, when being deposited and formed, the initial protection layer 205 is deposited at the same time without distinguishing between the regions. The trench 202 is filled up with the first protection layer 204 formed at the same time. When the mask layer 203 in the first region A is subsequently removed, the first protection layer 204 filling up the trench 202 can protect the base 200 at a bottom of the trench 202, and does not contact the residues generated by removing the mask layer 203, thereby improving a performance of the semiconductor structure.

A material of the first protection layer 204 includes a photoresist. The photoresist has good fluidity and a filling property as a protection layer. When the first protection layer 204 covering the upper surface and the sidewall of the mask layer 203 in the first region A is formed, the upper surface and the sidewall of the mask layer 203 in the first region A can be covered relatively uniformly and without a gap.

The formed first protection layer 204 on the upper surface of the mask layer 203 in the first region A has a thickness of 100 nanometers to 200 nanometers, and specifically 130 nanometers, 160 nanometers, or 190 nanometers.

If the first protection layer 204 on the upper surface of the mask layer 203 in the first region A has a very small thickness, when the mask layer 203 in the second region B is etched away, it is also easy to remove the first protection layer 204 in the first region A, which then affects the mask layer 203 in the first region A, in turn affects the subsequent removal of the mask layer 203 in the first region A, and hence affects the performance of the semiconductor structure. If the first protection layer 204 on the upper surface of the mask layer 203 in the first region A has a very large thickness, after the mask layer 203 in the second region B is removed, one thick first protection layer 204 is still provided in the first region A. The subsequent removal takes a relatively long time, which is not conducive to improving the efficiency of a preparing process of the semiconductor.

Figure 7:
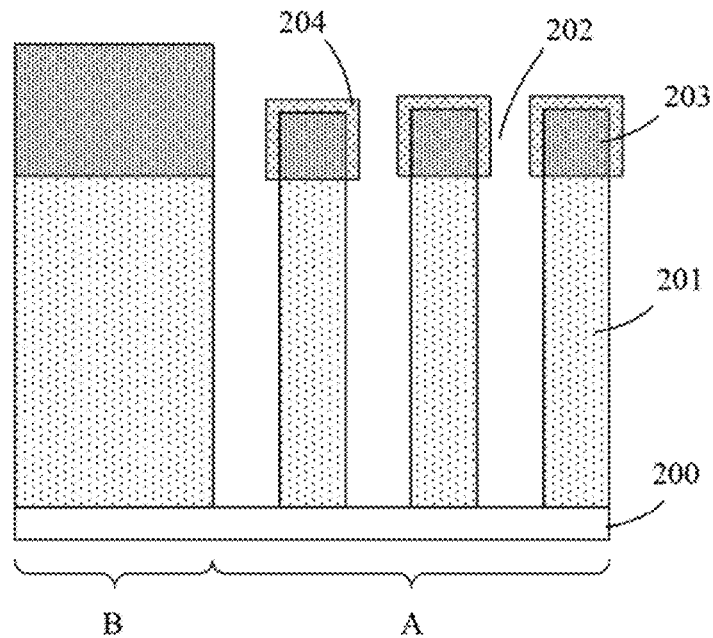

In other embodiments, referring to FIG. 7, the upper surface and the sidewall of the mask layer 203 in the first region A can be covered only with the first protection layer 204. If the first protection layer 204 is formed by an atomic layer deposition process, a dense and thinner first protection layer 204 can be formed, which saves materials and reduces costs of the removal of the mask layer 203 while protecting the mask layer 203 in the first region A.

The material of the first protection layer 204 formed by the atomic layer deposition process includes silicon oxide.

In other embodiments, not only the upper surface and the sidewall of the mask layer in the first region but also the bottom and a sidewall of the trench are covered with the first protection layer.

The first protection layer covering the bottom and the sidewall of the trench is formed with the atomic layer deposition process. When the mask layer in the first region is subsequently removed, the first protection layer located at the bottom and the sidewall of the trench can protect the base at the bottom of the trench, and is not in contact with the residues generated by removing the mask layer, thereby improving the performance of the semiconductor structure.

Figure 8:
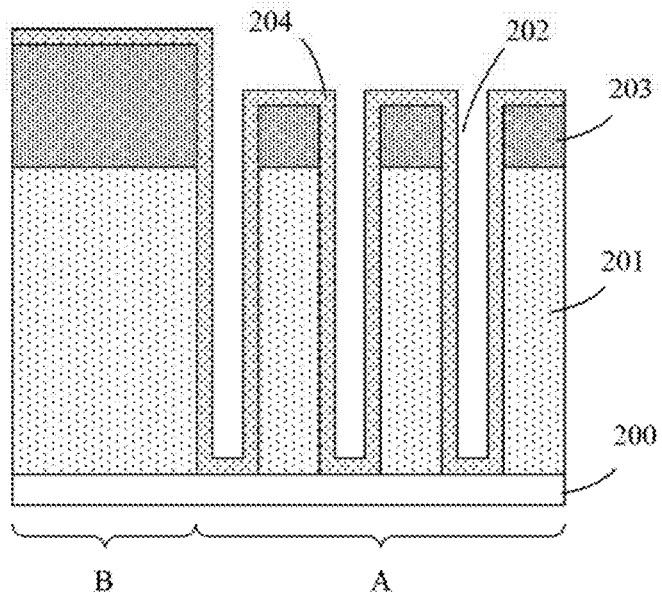

In other embodiments, referring to FIG. 8, not only the sidewall and the upper surface of the mask layer 203 in the first region A and the bottom and the sidewall of the trench 202 but also the upper surface and the sidewall of the mask layer 203 in the second region B are covered with the first protection layer 204.

Since not only the first region A but also the second region B are covered with the first protection layer 204, when the first protection layer 204 is formed, regions are not required to be distinguished, which is beneficial to overall formation of the semiconductor.

It can be understood that for the first protection layer 204 covering the upper surface and the sidewall of the mask layer 203 in the second region B, before the mask layer 203 in the second region B is removed, the first protection layer 204 on the upper surface of the mask layer 203 in the second region B needs to be removed.

Figure 9:
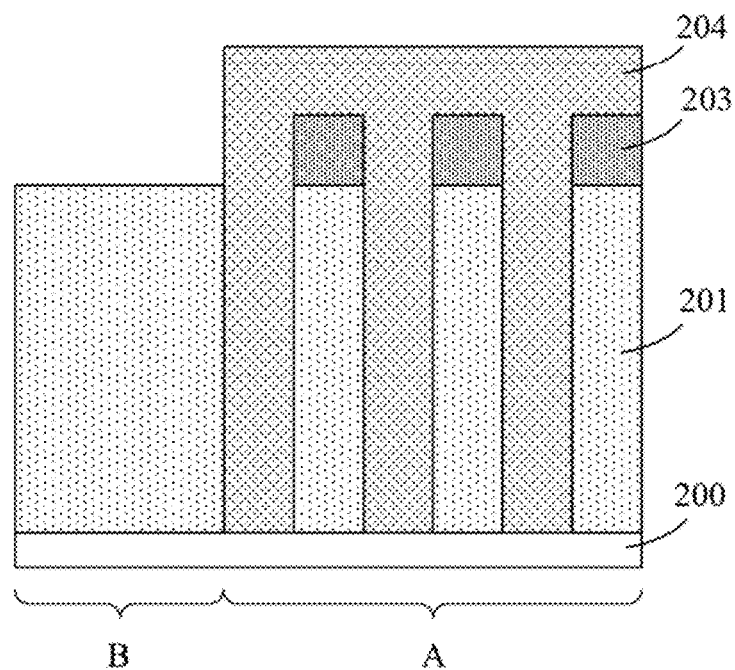

Referring to FIG. 9, in this embodiment, after the first protection layer 204 is formed, the mask layer 203 in the second region B is removed.

The mask layer 203 in the second region B is removed first. Since the upper surface and the sidewall of the mask layer 203 in the first region A have the first protection layer 204, the mask layer 203 in the first region A is not affected during the process for removing the mask layer 203 in the second region B. The first protection layer 204 is removed, and then the mask layer 203 in the first region A is removed. Since the mask layers 203 in the first region A and the second region B are removed separately, when the mask layers 203 in different regions are removed at the same time, an effect of an inconsistent thickness of the mask layers 203 in different regions on the process of removing the mask layer 203 is eliminated. At the same time, since the first protection layer 204 is provided on the upper surface and the sidewall of the mask layer of the first region A, the mask layer 203 in the first region A is not affected when the mask layer 203 in the second region B is removed. Therefore, the mask layer 203 can be completely removed without leaving residues of the mask layer. The insulating layer 201 in the first region A is not etched. The formed semiconductor structure has a relatively high flatness.

After the mask layer 203 in the second region B is removed, the first protection layer 204 is removed and the mask layer 203 in the first region A is removed.

Figure 10:
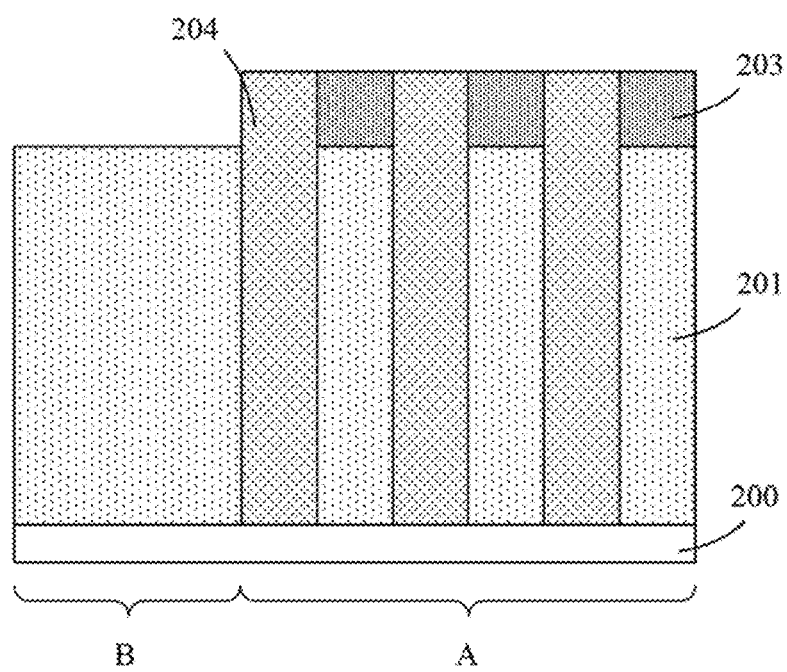
Figure 11:
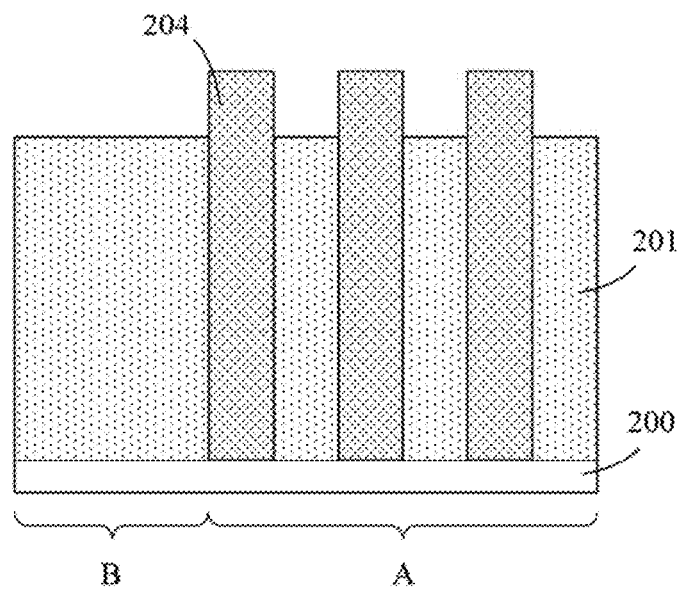
Figure 12:
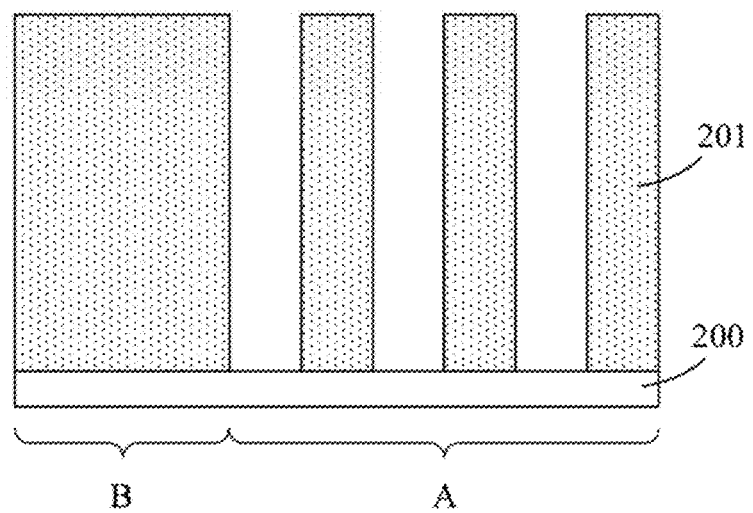

In this embodiment, a process step for removing the first protection layer 204 and the mask layer 203 in the first region A includes: referring to FIG. 10, removing a part of the first protection layer 204 to expose the mask layer 203 in the first region A; referring to FIG. 11, after exposing the mask layer 203 in the first region A, removing the mask layer 203 in the first region A; and referring to FIG. 12, after removing the mask layer 203 in the first region A, removing the remaining first protection layer 204.

The first protection layer 204 is removed step by step. When the mask layer 203 in the first region A is removed, the trench 202 is filled up with the first protection layer 204. The residues of the mask layer generated by removing the mask layer 203 in the first region A do not fall into the trench 202 and is not in contact with the base 200 at the bottom of the trench 202, which improves the performance of the semiconductor structure.

In other embodiments, a process step for removing the first protection layer and the mask layer in the first region includes: removing the entire first protection layer to expose the mask layer in the first region; and after exposing the mask layer in the first region A, removing the mask layer in the first region. Before the mask layer in the first region is removed, the first protection layer is completely removed, which is easier to implement in term of a process. The first protection layer can be completely removed with dry etching without affecting the mask layer in the first region.

In the forgoing process steps of this embodiment, the first protection layer 204 is removed with an oxygen-containing plasma. Since the material of the first protection layer 204 is the photoresist, and the oxygen-containing plasma can react quickly with the photoresist, a method for removing the first protection layer 204 includes: providing the oxygen-containing plasma to the first protection layer 204, where the oxygen-containing plasma reacts with the first protection layer 204 to generate carbon dioxide, carbon monoxide, and water. The oxygen-containing plasma reacts quickly with the first protection layer 204, and the first protection layer 204 can be quickly removed, which improves the removal efficiency of the photoresist.

In this embodiment, oxygen is used to form an oxygen-containing plasma. The oxygen used has a gas flow rate of 1000 standard milliliters per minute to 15000 standard milliliters per minute, and specifically, 5000 standard milliliters per minute, 10000 standard milliliters per minute, or 12000 standard milliliters per minute.

In the process for removing the first protection layer 204, it is also necessary to pass a carrier gas into a reaction chamber. The carrier gas includes argon or nitrogen.

In the forgoing process steps, the mask layer 203 is removed with a hydrogen-containing plasma. Since the material of the mask layer 203 is polysilicon, and polysilicon easily reacts with the hydrogen-containing plasma, the mask layer 203 can be quickly removed.

In this embodiment, the process for removing the mask layer 203 and the process for removing the first protection layer 204 are performed in the same reaction chamber. In this way, the entire process for removing the first protection layer 204 and the mask layer 203 is performed in the same reaction chamber, which avoids the risk of photoresist being contaminated by an external environment when the chamber is changed in different steps. At the same time, a process environment is simplified, so that the entire removal process is easier to achieve. In other embodiments, the removal of the first protection layer and the removal of the mask layer can be performed in different reaction chambers.

In this embodiment, before the mask layer 203 is removed, the first protection layer 204 covering the sidewall and the upper surface of the mask layer 203 in the first region A is formed. The mask layer 203 in the first region A and the mask layer 203 in the second region B are removed separately. The mask layer 203 in the second region B is first removed. Since the upper surface and the sidewall of the mask layer 203 in the first region A have the first protection layer 204, the mask layer 203 in the first region A is not affected in the process of removing the mask layer 203 in the second region B. The first protection layer 204 is removed, and then the mask layer 203 in the first region A is removed. Since the mask layers 203 in the first region A and the second region B are removed separately, an effect of an inconsistent thickness of the mask layers 203 in different regions on a process for removing the mask layer 203 is eliminated when the mask layers 203 in different regions are removed at the same time. In addition, since the upper surface and the sidewall of the mask layer 203 in the first region A have the first protection layer 204, the mask layer 203 in the first region A is not affected when the mask layer 203 in the second region B is removed. Therefore, the mask layer 203 can be completely removed with any residues of the mask layer 203. The insulating layer 201 in the first region A is not etched. The formed semiconductor structure has a higher flatness.

A second embodiment of the present application provides a method for forming a semiconductor structure, which is substantially the same as the first embodiment of the present application. The second embodiment is mainly distinct from the first embodiment in that before removal of a mask layer in a first region, a second protection layer is formed on an upper surface of an insulating layer of a second region. A method for forming a semiconductor structure according to the second embodiment of the present application will be described in detail below with reference to drawings. For the same or corresponding parts as the first embodiment, please refer to the description of the foregoing embodiment, which will not be repeated hereafter.

Figure 13:
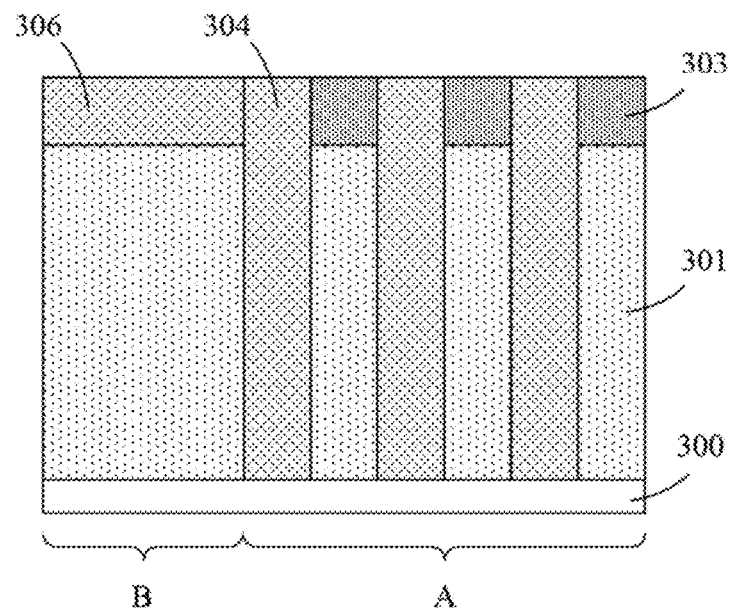
FIGS. 13 to 15 are schematic structural diagrams of steps of a method for forming a semiconductor structure according to a second embodiment of the present application.
Figure 14:
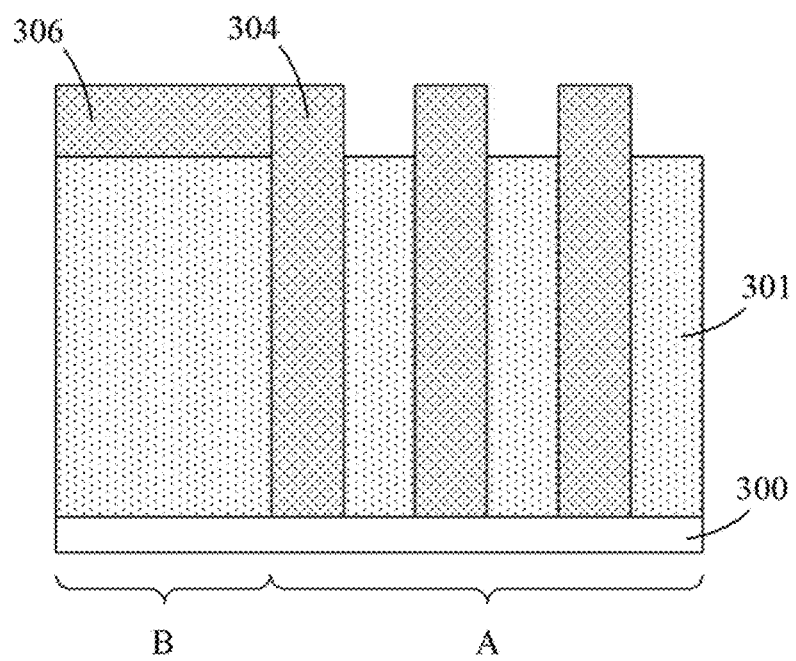
Figure 15:
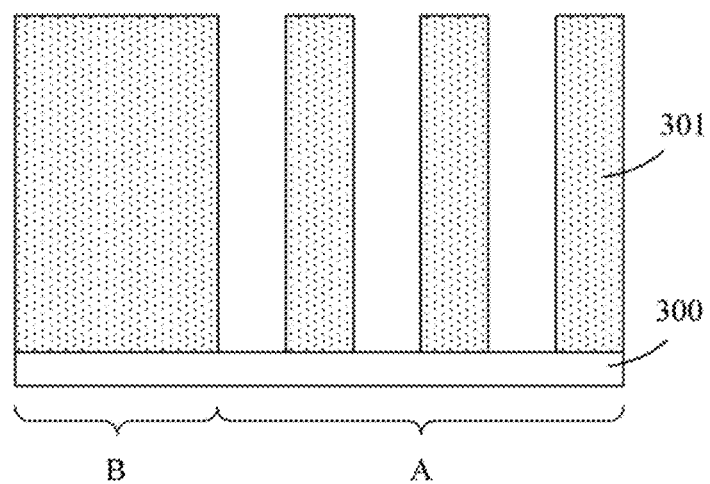

FIGS. 13 to 15 are schematic structural diagrams of steps of a method for forming a semiconductor structure according to a second embodiment of the present application.

In this embodiment, referring to FIG. 13, the semiconductor structure includes a first region A and a second region B, and also includes a base 300, an insulating layer 301, and a mask layer 303 that are stacked in sequence. After the mask layer 303 in the first region A is exposed, prior to removal of the mask layer 303 in the first region A, the method further includes: forming a second protection layer 306 covering the upper surface of the insulating layer 301 in the second region B; referring to FIG. 14, removing the mask layer 303 in the first region A; referring to FIG. 15, after removing the mask layer 303 in the first region A, removing the second protection layer 306.

In this embodiment, a material of the first protection layer 304 and a material of the second protection layer 306 are the same, and specifically may be polysilicon.

In this embodiment, before the mask layer 203 in the first region A is removed, the second protection layer 306 is formed on an upper surface of the insulating layer 301 in the second region B, which ensures that when the mask layer 303 in the first region A is removed, the insulating layer 301 in the second region B is not affected, thereby improving the performance of the semiconductor structure.

Those skilled in the art can understand that the forgoing embodiments are specific examples for realizing the present application. In actual applications, various changes can be made in forms and details without departing from the spirit and scope of the present application. Changes and modifications can be made by those skilled in the art without departing from the spirit and scope of the present application. Therefore, the protection scope of the present application shall be subject to the scope defined by the claims.

What is claimed is:

1. A method for forming a semiconductor structure, the semiconductor structure comprising a first region and a second region, the method comprising:
   providing a base, an insulating layer, and a mask layer that are stacked in sequence, wherein the first region has at least one trench penetrating the mask layer and the insulating layer, and the mask layer has an upper surface in the second region higher than that in the first region;
   forming a first protection layer, wherein the upper surface and a sidewall of the mask layer in the first region are covered with the first protection layer;
   after forming the first protection layer, removing the mask layer in the second region;
   after removing the mask layer in the second region, removing the first protection layer; and
   removing the mask layer in the first region.

2. The method of forming the semiconductor structure according to claim 1, wherein a method for forming the first protection layer comprises: forming the first protection layer at a bottom and on a sidewall of the trench.

3. The method for forming the semiconductor structure according to claim 2, wherein a process step for removing the first protection layer and the mask layer in the first region comprises:
   removing a part of the first protection layer to expose the mask layer in the first region;

after exposing the mask layer in the first region, removing the mask layer in the first region; and after removing the mask layer in the first region, removing the remaining first protection layer.

4. The method for forming the semiconductor structure according to claim 2, wherein a process step for removing the first protection layer and the mask layer in the first region comprises:

removing the entire first protection layer to expose the mask layer in the first region;

after exposing the mask layer in the first region, removing the mask layer in the first region.

5. The method for forming the semiconductor structure according to claim 3, wherein subsequent to exposure of the mask layer in the first region and prior to removal of the mask layer in the first region, the method further comprises:

forming a second protection layer covering an upper surface of the insulating layer in the second region; and after removing the mask layer in the first region, removing the second protection layer.

6. The method for forming the semiconductor structure according to claim 4, wherein subsequent to exposure of the mask layer in the first region and prior to removal of the mask layer in the first region, the method further comprises:

forming a second protection layer covering an upper surface of the insulating layer in the second region; and after removing the mask layer in the first region, removing the second protection layer.

7. The method for forming the semiconductor structure according to claim 1, wherein a process step for forming the first protection layer comprises: forming the first protection layer covering the upper surface and the sidewall of the mask layer in the second region.

8. The method for forming the semiconductor structure according to claim 7, wherein prior to removal of the mask layer in the second region, the method further comprises: removing the first protection layer on the upper surface of the mask layer in the second region.

9. The method for forming the semiconductor structure according to claim 1, wherein the trench is filled up with the formed first protection layer, and the upper surface of the mask layer in the first region is covered with the first protection layer.

10. The method for forming the semiconductor structure according to claim 1, wherein prior to formation of the first protection layer, the method further comprises: forming an initial protection layer, wherein the trench is filled up with the formed initial protection layer, and the upper surface of the mask layer in the second region is covered with the initial protection layer.

11. The method for forming the semiconductor structure according to claim 10, wherein the process step for forming the first protection layer comprises: before removing the mask layer in the second region, removing the initial protection layer on the upper surface of the mask layer in the second region to expose the mask layer in the second region, wherein the remaining initial protection layer is taken as the first protection layer.

12. The method for forming the semiconductor structure according to claim 1, wherein the formed first protection layer on the upper surface of the mask layer in the first region has a thickness of 100 nm to 200 nm.

13. The method for forming a semiconductor structure according to claim 1, wherein a material of the first protective layer comprises a photoresist, and a material of the mask layer comprises polysilicon.

14. The method for forming the semiconductor structure according to claim 13, wherein the first protection layer is removed with an oxygen-containing plasma.

15. The method for forming the semiconductor structure according to claim 13, wherein the mask layer is removed with a hydrogen-containing plasma.

16. The method for forming the semiconductor structure according to claim 1, wherein the process for removing the mask layer and the process for removing the first protective layer are performed in a same reaction chamber.

* * * * *